United States Patent [19]
Yeh et al.

[11] Patent Number: 5,786,255
[45] Date of Patent: Jul. 28, 1998

[54] METHOD OF FORMING A METALLIC OXIDE SEMICONDUCTOR

[75] Inventors: Wen-Kuan Yeh, Chupei; Coming Chen, Taoyuan Hsien; Jih-Wen Chou, Hsinchu, all of Taiwan

[73] Assignee: United Miroelectronics Corporation, Taiwan, Taiwan

[21] Appl. No.: 863,426

[22] Filed: May 27, 1997

[30] Foreign Application Priority Data

Apr. 8, 1997 [TW] Taiwan .................... 86104401

[51] Int. Cl.⁶ .................................... H01L 21/336
[52] U.S. Cl. .................. 438/299; 438/300; 438/305; 438/691
[58] Field of Search ................. 438/299, 300, 438/301, 303, 305, 306, 307, 691, 692, 959, 174, 185

[56] References Cited

U.S. PATENT DOCUMENTS

| | | |
|---|---|---|
| 4,359,816 | 11/1982 | Abbas et al. ............ 438/303 |
| 4,803,173 | 2/1989 | Sill et al. ............... 438/303 |
| 5,162,254 | 11/1992 | Usui et al. .............. 438/691 |
| 5,270,234 | 12/1993 | Huang et al. ........... 438/305 |
| 5,422,289 | 6/1995 | Pierce .................... 438/297 |
| 5,489,543 | 2/1996 | Hong ..................... 438/305 |

*Primary Examiner*—Michael Trinh
*Attorney, Agent, or Firm*—Rabin, Champagne & Lynt, P.C.

[57] ABSTRACT

A method of forming MOS components provides that after the formation of the gate and the doped source/drain regions, a polysilicon layer is deposited and planarized using a chemical-mechanical polishing method. The resulting unremoved polysilicon layer acts as source/drain terminals. Through these arrangements, the ion doped source/drain regions will have shallow junctions, yet their junction integrity will not be compromised by subsequent contact window etching and metallization processes. Furthermore, the front-end processes for forming the MOS component provide a good planar surface that offers great convenience for the performance of subsequent back-end processes.

9 Claims, 4 Drawing Sheets

METHOD OF FORMING A METALLIC OXIDE SEMICONDUCTOR

BACKGROUND OF THE INVENTION

1. Field of Invention

This invention relates in general to a method of manufacturing integrated circuits (ICs). More particularly, this invention relates to a method of forming metal oxide semiconductor (MOS) components.

2. Description of Related Art

With the recent advances in semiconductor manufacturing techniques, there is a trend towards fabricating larger wafers having smaller line widths, in MOS component designs. Through these arrangements, integrated circuits having more powerful functions and lower production costs can be realized. However, as line widths are reduced to the sub-quarter micron domain, for example, a line width of 0.18 µm or smaller, the channel length of a MOS transistor is correspondingly reduced. This will lead to difficult control problems, such as short channel effects and the punch-through of doped source/drain regions.

One effective method of containing the short channel effects is to add a lightly doped region in part of the source/drain region bordering the channel. This type of configuration is known as a lightly doped drain (or LDD for short).

FIGS. 1A through 1D are a series of cross-sectional views showing the conventional manufacturing flow of an LDD.

Referring to FIG. 1A, a semiconductor substrate 10 doped with a first type of ions, for example, a boron doped p-type silicon substrate, is provided. A field oxide layer and a gate are formed on top of substrate. Thereafter, a second type of ions 11, example, arsenic or phosphorus ions having an ion concentration of about $10^{13}/cm^2$, are implanted into the semiconductor substrate 10 to define lightly doped drains 16.

Referring next to FIG. 1B, a silicon dioxide layer 18 is formed over the semiconductor substrate 10 using, for example, a chemical vapor deposition (CVD) method. Then, at a high temperature of about 900° C. to about 1000° C. the second type of ions 11 are diffused. In the meantime, a part of the semiconductor substrate 10 damaged through the ion implantation process is restored through annealing.

Referring next to FIG. 1C, anisotropic etching is used to etch out spacers 18a. A large portion of the silicon dioxide layer 18 formed above the semiconductor substrate 10 is removed using a dry etching method, in which the thickness of the layer is used as a reference. Since the thickness of the silicon dioxide layer 18 attached to sidewalls 19 of the gate 14 is greater than at other places, after the anisotropic dry etching operation is performed, part of the original silicon dioxide layer 18 will still be attached to the sidewalls of the gate 14, thus forming the spacers 18a there.

Referring to FIG. 1D, using the field oxide layer 12, the gate 14 and the sidewall spacers 18a as masks, a heavy doping is performed, thus forming a structure having the lightly doped drain regions 16 next to source/drain regions 17 in the semiconductor substrate 10. The heavy doping can include, for example, doping a second type of ions having a concentration of about $10^5/cm^2$.

The above method of forming LDD requires that the doped source/drain regions 17 have a corresponding shallow junction. For example, when the line width is 0.25 µm, its junction depth is about 1500 Å. However, when the line width is reduced to 0.1 µm, the junction depth can only be about 800 Å. to about 1000 Å. Also the punch-through margins of the source/drain regions will approach each other, due the increase in the level of integration as a result of a reduction in the line width in the MOS components. Hence, current leakage will occur. Moreover, after subsequent contact window etching and metallization processes are completed, good junction integrity must be maintained. However, the conventional LDD process for forming a shallow junction can not overcome the problem of damage to the junction.

SUMMARY OF THE INVENTION

It is therefore an object of this invention to improve the process of manufacturing MOS components, such that a shallow junction is formed in the ion doped source/drain region after the formation of a LDD.

It is a further object of the present invention to maintain good junction integrity even after subsequent contact etching and metallization processes are performed.

To achieve the objects of this invention, a method of forming a MOS component is provided, which includes providing a semiconductor substrate having a silicon nitride layer and a number of trenches already formed above. An insulating layer is formed which covers and fills the trenches. Then, the silicon nitride layer and the trenches are planarized using a chemical-mechanical polishing method. Using a photolithographic process, the silicon nitride layer is defined. Then, etching is performed to form openings exposing the semiconductor substrate. A gate oxide layer and a gate conducting layer are formed in sequence, filling up the openings. part of the gate oxide layer and the gate conducting layer above the silicon nitride layer is removed, using a chemical-mechanical polishing method. The silicon nitride layer is completely removed. Then, spacers are formed on the sidewalls of the gate oxide layer and the gate conducting layer. Both before and after the formation of the spacers, ions are implanted into the semiconductor substrate to form ion doped LDD regions. A polysilicon layer is formed, filling up the areas above the ion doped regions. Then, the trench, spacers, gate conducting layer and the polysilicon layer are planarized using a chemical-mechanical polishing method, leaving only the polysilicon layer above the ion doped regions as the source/drain terminals.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

Figure 1A:
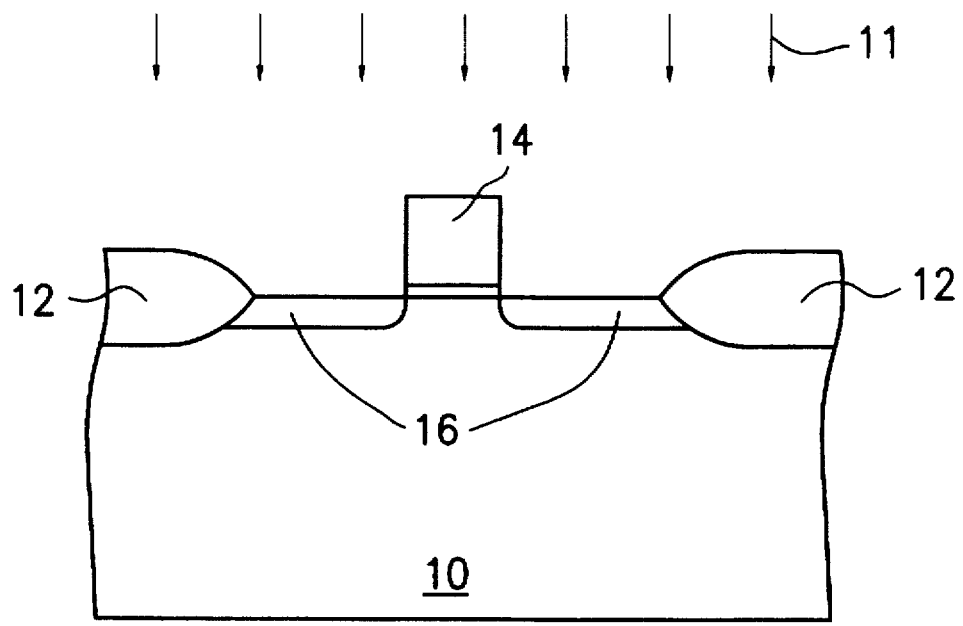
FIGS. 1A through 1D are a series of diagrams showing a conventional manufacturing flow for forming a lightly doped drain in a MOS component.
Figure 1B:
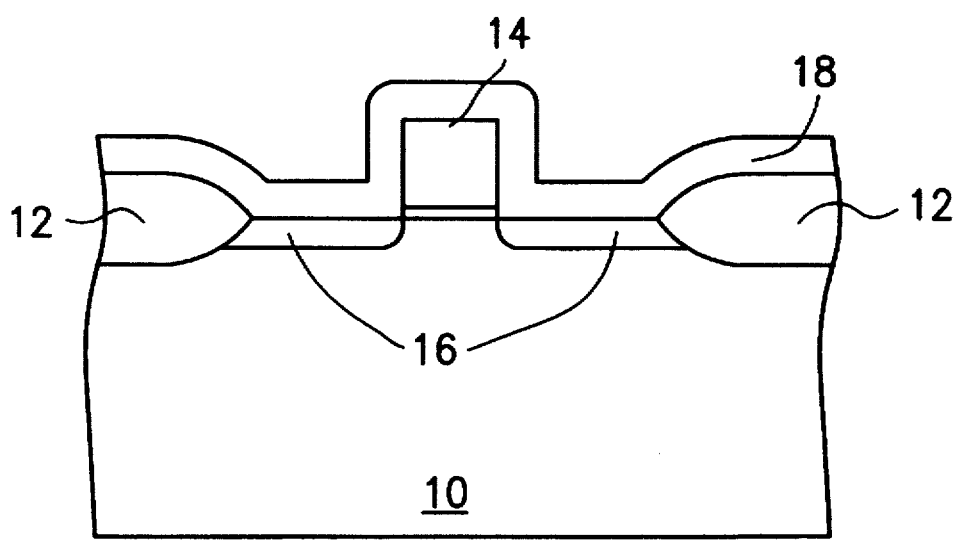
Figure 1C:
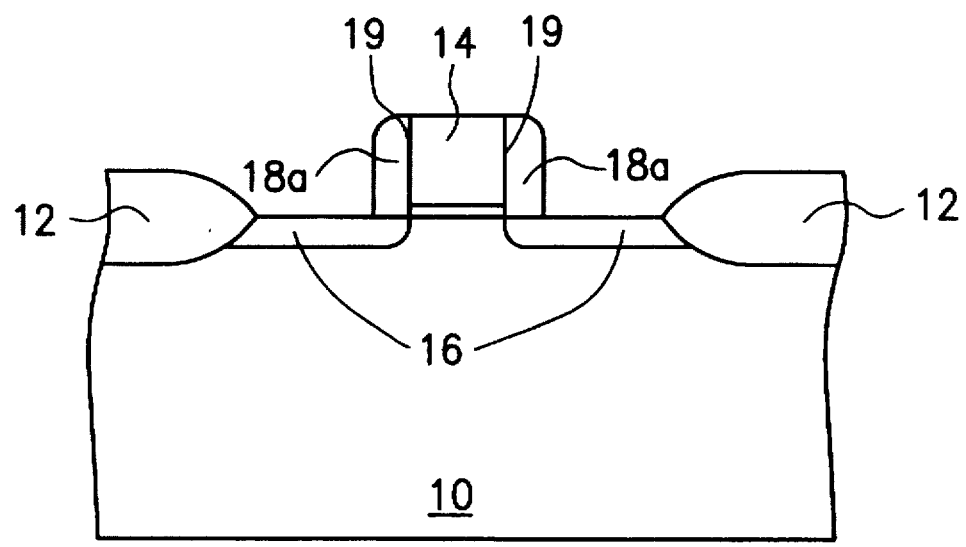
Figure 1D:
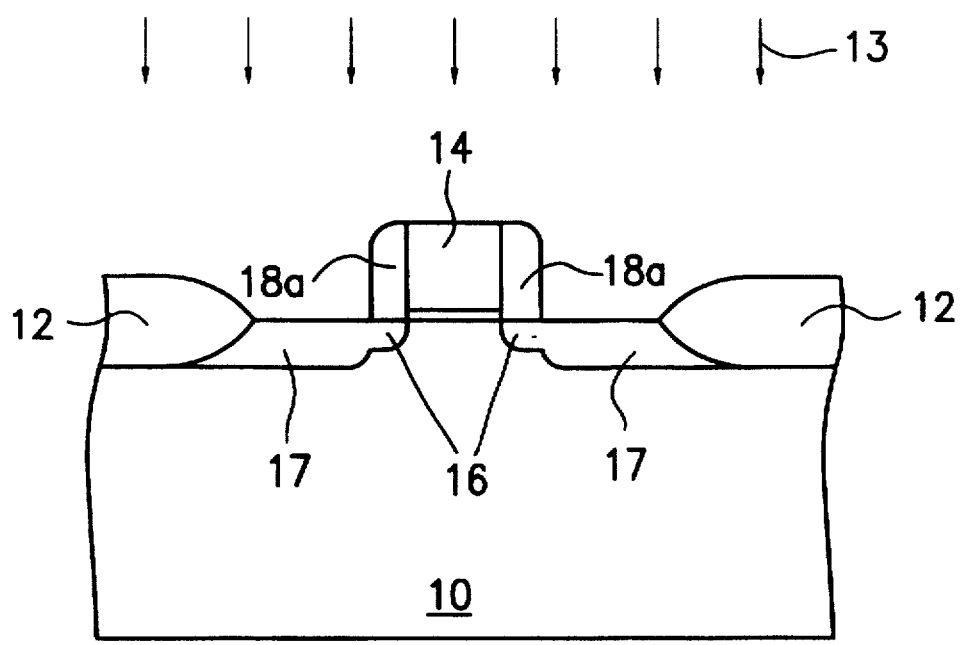
Figure 2A:
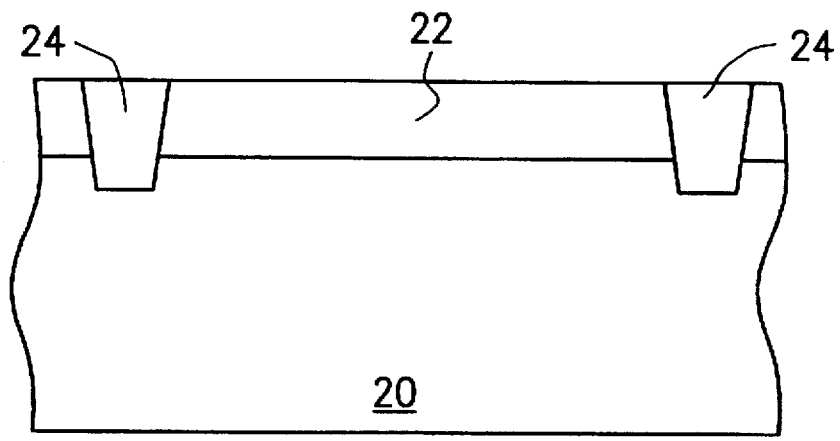
FIGS. 2A through 2F are a series of diagrams showing a manufacturing flow for forming a lightly doped drain in a MOS component, according to this invention.

Referring to FIG. 2A, a silicon nitride layer 22 deposited to a thickness of, for example, about 2500 Å is formed above a semiconductor substrate 20, such as a silicon substrate. Then, trenches 24 are formed. The trenches are filled with an insulating material to form shallow trench isolating (STI) regions, thus defining an active region of a MOS component.

Next, the silicon nitride layer 22 and the filled trenches 24 are planarized using chemical-mechanical polishing (CMP), so that the silicon nitride layer 22 and filled trenches 24 have a thickness of about 2000 Å, for example.

Figure 2B:
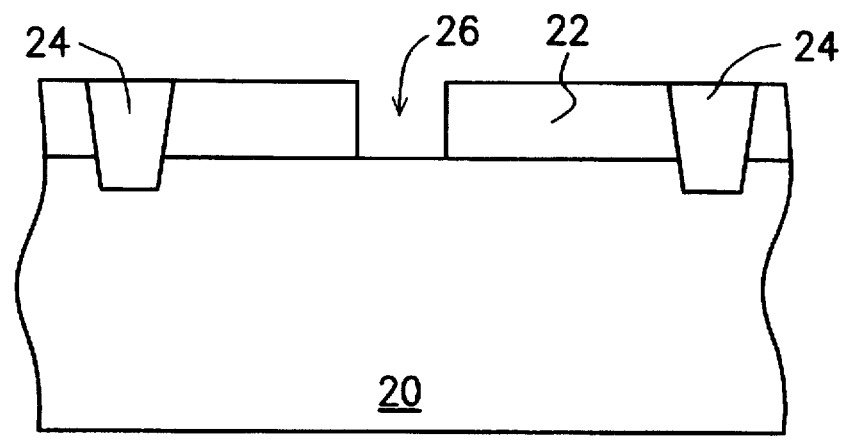

Referring to FIG. 2B, a photolithographic process is used to define the silicon nitride layer 22, and etch out an opening 26 exposing the semiconductor substrate 20 in designated areas.

Figure 2C:
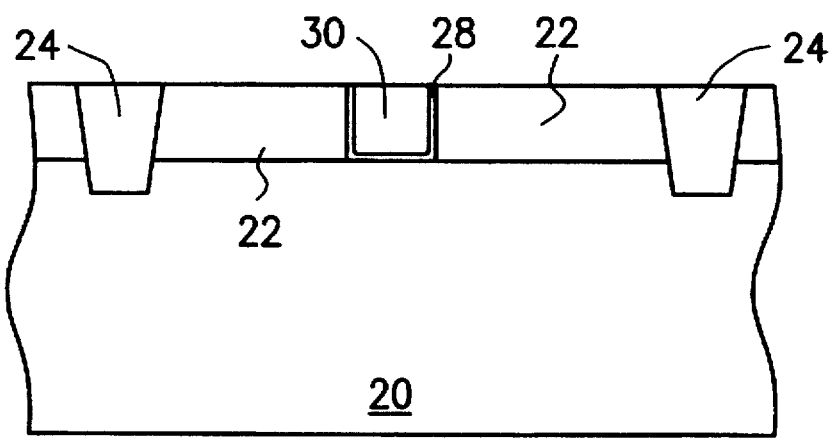

Referring to FIG. 2C, a gate oxide layer 28 and a gate conducting layer 30 are formed in sequence over silicon nitride layer 22, filling up the opening 26. The gate oxide layer 28 is a silicon dioxide layer, while the gate conducting layer 30 can be, for example, a polycide layer assembled from a polysilicon layer and a tungsten silicide (SiWx) layer. Thereafter, the portion of the gate conducting layer 30 and the gate oxide layer 28 above the silicon nitride layer 22 is removed using a CMP method, with the silicon nitride layer 22 acting as a polishing end point.

Figure 2D:
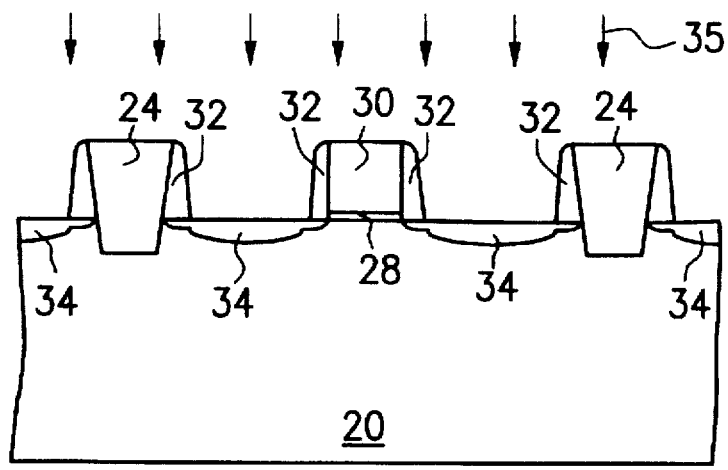

Referring to FIG. 2D, the silicon nitride layer 22 is completely removed, for example, by wet etching using a phosphoric acid solution. Then, an insulating layer (not shown in the figure) formed above the semiconductor substrate 20 is etched back so as to form spacers 32 on the sidewalls of the gate oxide layer 28, the gate conducting layer 30 and the filled trenches 24. Also, both before and after the formation of spacers 32, ions 35 are implanted during separate ion implantation operations to create ion doped regions 34 having an LDD structure. The ion implantation operations include implanting ions at a somewhat lighter concentration, and later at a more heavier concentration.

Figure 2E:
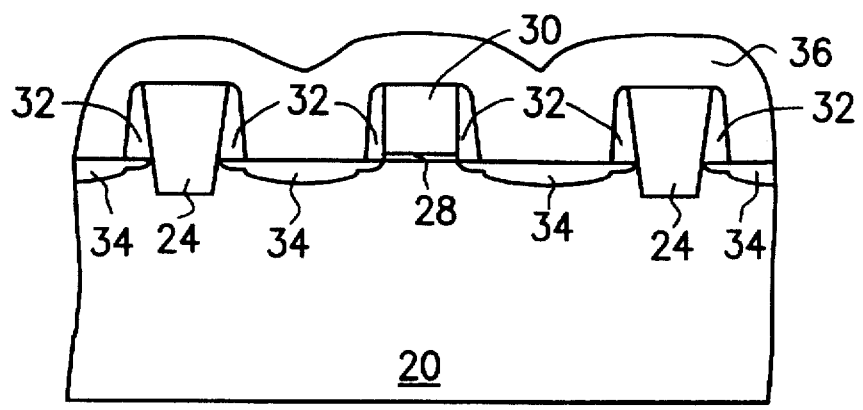

Referring to FIG. 2E, a polysilicon layer 36 is deposited, which covers the filled trenches 24, the gate conducting layer 30, and the spacers 32, and fills up the areas above the ion doped regions 34, which are formed in an upper portion of the semiconductor substrate 20. The polysilicon layer 36 can be an ion doped polysilicon layer, or a polysilicon layer which is doped with ions in a subsequent ion implantation operation.

Figure 2F:
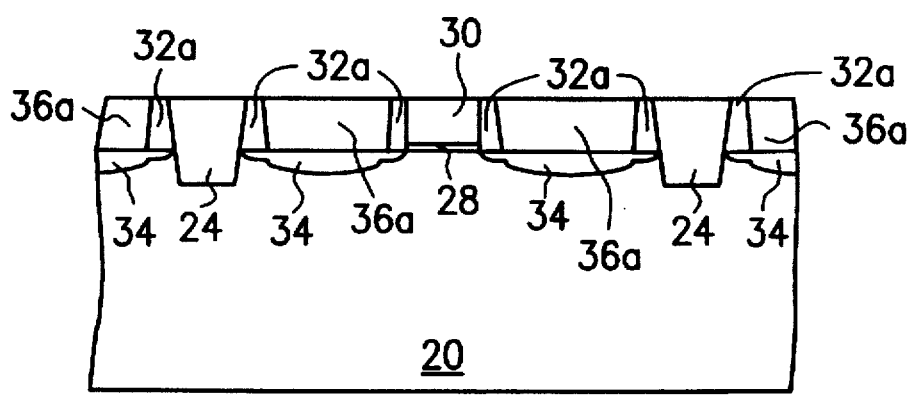

Referring to FIG. 2F, the filled trenches 24, the gate conducting layer 30, the spacers 32 and the polysilicon layer 36 are planarized using a CMP method. This results in the removal of the polysilicon layer 36 above the trenches 24, the gate conducting layer 30 and the spacers 32, and leaves behind only the polysilicon layer 36 above the ion doped regions 34, thus forming the source/drain terminals 36a of the MOS component. In summary, this invention has the following characteristics:

1) The silicon nitride layer 22 obtained during the formation of the shallow trench isolation region can be directly used to define a pattern for the gate production. This eliminates an extra processing step.

2) The thickness of the gate as well as the source/drain terminals can be closely controlled through CMP and planarization processes.

3) The front-end processes for forming a MOS component according to this invention provide a good planar surface that offers great convenience for the performance of subsequent back-end processes, for example, metallization process.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of forming a MOS component, comprising:

providing a semiconductor substrate, a silicon nitride layer thereabove, and a plurality of trenches formed within the silicon nitride layer;

filling the trenches with an isolating layer;

planarizing the silicon nitride layer and the filled trenches using chemical-mechanical polishing;

defining the silicon nitride layer using a photolithographic process, to etch openings into the silicon nitride layer and expose the semiconductor substrate;

sequentially forming a gate oxide layer and a gate conducting layer over the silicon nitride layer and filling the openings;

removing a portion of the gate oxide layer and the gate conducting layer above the silicon nitride layer using chemical-mechanical polishing;

completely removing the silicon nitride layer;

implanting ions into the semiconductor substrate;

after said implanting ions, forming spacers on sidewalls of the gate oxide layer and the gate conducting layer;

after said forming spacers, implanting more ions into the semiconductor substrate, said implanting ions and said implanting more ions forming ion doped LDD regions within the semiconductor substrate;

forming a polysilicon layer above the semiconductor substrate to cover an area above the ion doped LDD regions; and planarizing the filled trenches, spacers, gate conducting layer and the polysilicon layer using chemical-mechanical polishing, leaving the polysilicon layer only above the ion doped LDD regions to form source/drain terminals.

2. The method according to claim 1, wherein said providing a semiconductor substrate includes providing a silicon substrate.

3. The method according to claim 1, wherein said providing a silicon nitride layer includes providing a silicon nitride layer having a thickness of about 2500 Å.

4. The method according to claim 1, wherein said planarizing the silicon nitride layer reduces a thickness of the silicon nitride layer to about 2000 Å.

5. The method according to claim 1, wherein said sequentially forming includes forming a polycide gate conducting layer comprising a polysilicon layer and a tungsten silicide layer.

6. The method according to claim 1, wherein said completely removing includes wet etching the silicon nitride layer.

7. The method according to claim 1, wherein said completely removing includes using phosphoric acid to remove the silicon nitride layer.

8. The method according to claim 1, wherein said forming a polysilicon layer includes forming an ion doped plysilicon layer.

9. The method according to claim 1, further comprising doping the polysilicon further comprising doping the polysilicon layer with ions after the formation thereof.

* * * * *